United States Patent [19]

Choi

[11] Patent Number: 5,878,092
[45] Date of Patent: Mar. 2, 1999

[54] TRACE-BACK METHOD AND APPARATUS FOR USE IN A VITERBI DECODER

[75] Inventor: Young-Bae Choi, Seoul, Rep. of Korea

[73] Assignee: Daewoo Electronics Co., Ltd., Seoul, Rep. of Korea

[21] Appl. No.: 876,554

[22] Filed: Jun. 16, 1997

[30]    Foreign Application Priority Data

Jun. 14, 1996 [KR]   Rep. of Korea ................. 96-21448

[51] Int. Cl.[6] .................................................. H03M 13/12
[52] U.S. Cl. ...................... 375/341; 371/43.6; 371/43.7
[58] Field of Search ................... 375/262, 265, 375/341; 371/43.1, 43.4, 43.6, 43.7

[56]      References Cited

U.S. PATENT DOCUMENTS 4,571,734  2/1986  Dolivo et al. ........................ 375/291
5,329,537  7/1994  Alard et al. ........................ 371/43.6
5,511,080  4/1996  Itoi et al. .......................... 371/43.7
5,712,880  1/1998  Rim et al. ............................ 375/341

*Primary Examiner*—Stephen Chin
*Assistant Examiner*—Jeffrey W. Gluck
*Attorney, Agent, or Firm*—Anderson, Kill & Olick, P.C.

[57]           ABSTRACT

A trace-back apparatus to select a most likely path for use in a Viterbi decoder comprises one or more processing elements to carry out tracing-back based on a sequence of decision vectors coupled among themselves in a pipeline fashion. In each processing element, N number of decision vectors are delayed during a predetermined period to generate 1-step to N-step delayed decision vectors; and an input state is stored during the predetermined period to generate an 1-step delayed state; and multiplexing means multiplexs sequentially the 1-step to N-step delayed decision vectors based on the 1-step delayed state to provide an N-step trace-back state to the next processing element.

7 Claims, 5 Drawing Sheets

TRACE-BACK METHOD AND APPARATUS FOR USE IN A VITERBI DECODER

FIELD OF THE INVENTION

The present invention relates to a method and apparatus for implementing a maximum likelihood decoding of convolutional codes, and more particularly, to a method and apparatus capable of processing a plurality of steps of trace-back per one clock period in a Viterbi decoder in an effective manner.

DESCRIPTION OF THE PRIOR ART

Convolutional codes are widely used in digital communication systems to decrease the probability of making errors on a given noisy channel. They are characterized by a constraint length K and a code rate $k_0/n_0$, $n_0$ channel symbols being generated by the encoder for $k_0$ bits of input data.

By using the convolutional codes, a large coding gain can be obtained for a large memory m, or equivalently, a large constraint length $K=m+k_0$. An encoder for such codes is a finite-state apparatus with $2^m$ states. The complexity of a maximum-likelihood decoder is approximately proportional to the number of states, i.e., it grows exponentially with m.

A Viterbi decoder is a maximum likelihood decoder that provides a forward error correction. Viterbi decoding is used in decoding a sequence of encoded symbols, such as a bit stream. The bit stream can represent encoded information in telecommunication transmission through various media with each set of bits representing a symbol instant. In the decoding process, the Viterbi decoder works back through a sequence of possible bit sequences at each symbol instant to determine which bit sequence has most likely been transmitted. The possible transitions from a bit at one symbol instant, or state, to a bit at a next, subsequent, symbol instant or state is limited. Each possible transition from one state to a next state can be shown graphically and defined as a branch. A sequence of interconnected branches defines a path. Each state can only transit to a limited number of next states upon receiving a next bit in the bit stream. Thus, some paths survive during the decoding process and other paths do not. By eliminating those transition paths that are not permissible, computational efficiency can be improved in determining those paths most likely to survive. The Viterbi decoder typically defines and calculates a branch metric associated with each branch and employs this branch metric to determine which paths will survive and which paths will not.

A branch metric is calculated at each symbol instant for each possible branch. Each path has an associated metric, an accumulated cost, that is updated at each symbol instant. For each possible transition, the accumulated cost for the next state is obtained by selecting a smaller one of the sums of the branch metrics for different possible transitions and the path metrics at the previous states.

While several paths survive the transition from one symbol instant to a next symbol instant, there is only one minimum accumulated cost path. A sequence of symbol instants tracing back through the trellis that extends a path with the minimum accumulated cost defines the length, or decoding depth D, of a trace-back. The individual state in the trellis associated with the minimum accumulated cost in a trace-back is translated into a most likely bit to have been transmitted in that symbol instant. The bit is referred to as a decoded symbol.

Referring to FIG. 1, there is shown a schematic block diagram of a conventional Viterbi decoder, which is characterized by a constraint length K=7 and a code rate $K_0/n_0=\frac{1}{2}$ so that $M=2^m=64$ ($m=K-K_0=6$) states are allowed.

Convolutional encoded data is inputted to all of M, i.e., 64, branch metric units (BMU'S). Each branch metric unit 11-i is indicated by an i-th state indication signal, which represents an i-th state, expressed in terms of bits $S0_i$ to $S5_i$, among the 64 states and two possible branches of the i-th state, i.e., two states which can be led to the i-th state. The i-th branch metric unit 11-i calculates two i-th branch metric values, $BM_{i1}$ and $BM_{i2}$, for two possible branches of the i-th state based on the instant convolutional encoded data. two i-th branch metric values, $BM_{i1}$ and $BM_{i2}$ are provided to an i-th add-compare-select unit(ACSU) 12-i.

The i-th add-compare-select unit 12-i determines a maximum likelihood path based on the i-th branch metric values, $BM_{i1}$ and $BM_{i1}$ fed from the i-th branch metric unit 11-i and two previous i-th path metric values, $PM_{i1}$ and $PM_{i2}$, of the i-th state, each of the two previous i-th path metric values, $PM_{i1}$ and $PM_{i2}$, being an accumulated cost, i.e., a path metric value, of a state at the other end of each of the two possible branches at a preceding time. In other words, the i-th branch metric value $BM_{ij}$ (j=1,2) is added to the corresponding i-th path metric value $PM_{ij}$; the two added results are compared with each other; and a minimum value is provided as an updated i-th accumulated cost, i.e., an updated i-th path metric value $PM_{ui}$ to a path metric network 14.

The i-th add-compare-select unit 12-i receives a pair of path metric values corresponding to the two possible branches for a state following the i-th state selected from 64 updated path metric values in the path metric network 14, i ranging from 0 to 63.

In the meantime, the i-th add-compare-select unit 12-i also provides an i-th decision bit $DB_i$ for the updated i-th path metric value $PM_{ui}$ to a survivor memory unit 13, wherein the i-th decision bit $DB_i$ represents a decision bit for indicating one of the two i-th branch metric values, $BM_{i1}$ and $BM_{i2}$, corresponding to the updated. i-th path metric value $PM_{ui}$. The decision bit has $k_0(=1)$ dimension for a $k_0/n_0$ convolutional code. Total $k_0 \times M$ (=64) decision bits from all M (=64) add-compare-select units form a 64-bit decision vector $DV_k$ for the current convolutional encoded data $CE_k$. The survivor memory unit 13 stores 64-bit decision vectors $DV_k$'s and traces back up to a predetermined decoding depth D based on the 64-bit decision vectors $DV_k$'s to find unencoded data, i.e., Viterbi decoded data.

Referring to FIG. 2, there is shown a conventional survivor memory unit 13 in FIG. 1 with a decoding depth 96, wherein 97 processing elements 20-1 to 20-97 are coupled among themselves in a pipeline trace-back fashion for tracing-back over the decoding depth 96. The current decision vector $DV_k$ and any state $S_k[5 \ldots 0]$, e.g., 000000, are inputted to the first processing element 20-1; and two-step preceding decision vector $DV_{k-2}$ and two-step preceding state $S_{k-2}$ are provided to the second processing element 20-2, and so on, wherein the two-step preceding state $S_{k-2}$ is obtained by tracing-back any state $S_k$ over one-step based on the preceding decision vector $DV_{k-1}$. Since each processing element carries out one-step trace-back per one clock period, the last processing element 20–97 generates Viterbi decoded data $S_{k-194}[5]$, which results from tracing-back, as many as 97 steps, said any state $S_k$ based on the 97 preceding decision vectors $DV_{k-98}$ to $DV_{k-194}$.

FIG. 3 shows a block diagram of a processing element in FIG. 2 for illustrating the one-step tracing-back process for a K=7 and $k_0/n_0=\frac{1}{2}$ Viterbi decoder. Each processing element has a delay 31, a buffer 33, a multiplexor(MUX) 35 and a shift register 37; and carries out one-step trace-back.

At each clock period, a decision vector $DV_k$ is shifted into the delay 31 and a preceding decision vector $DV_{k-1}$ already present is shifted toward the buffer 33 and the multiplexor 35. Also during each clock period, a state $S_k$ with 6 bits is coupled to the shift register 37 and a preceding state $S_{k-1}[5 \ldots 0]$ already present is coupled to the multiplexor 35 as a selection signal for selecting one bit among the 64-bit preceding decision vector $DV_{k-1}$. The selected decision bit is provided to a shift register of the next processing element as a first bit $S_{k-2}[5]$ of a two-step preceding state $S_{k-2}$ and to the shift register 37. In the meantime, anterior 5 bits $S_{k-1}[5 \ldots 1]$ of the preceding state $S_{k-1}[5 \ldots 0]$ are shifted by one bit to be provided to the shift register of the next processing element as $S_{k-2}[4 \ldots 0]$.

Since, however, in the conventional trace-back apparatus, a processing element for one-step trace-back must use two 64-bit registers, one 64:1 multiplexor and one shift register for K=7 and $k_0/n_0=\frac{1}{2}$, a substantial amount of storage space and hardware for even a moderate speed is required, rendering a VLSI implementation of the conventional Viterbi decoder difficult.

SUMMARY OF THE INVENTION

It is, therefore, a primary object of the present invention to provide a method and apparatus for processing a trace-back in a Viterbi decoder with a minimum number of storage devices by carrying out a plurality of steps of trace-back in one clock period so that a suitable VLSI implementation thereof can be performed.

In accordance with the invention, there is provided a trace-back apparatus to select a most likely path for use in a Viterbi decoder with a code rate $k_0/n_0$, no channel symbols being generated by the encoder for $k_0$ bits of input data, wherein a plurality of processing elements, determined based on a decoding depth D, to carry out tracing-back based on a sequence of decision vectors, are coupled with each other in a pipeline fashion, each processing element comprising:

means for delaying a multiplicity N of decision vectors during a predetermined period to generate 1-step to N-step delayed decision vectors, wherein the decision vectors are sequentially inputted at intervals of the predetermined period and N is greater than 1 and equal to or less than the decoding depth D;

means for storing an N-step delayed decision vector during the predetermined period to provide an (N+1)-step delayed decision vector already present to a next processing element;

means for saving an input state during the predetermined period to generate a 1-step delayed state; and means for multiplexing sequentially the 1-step to N-step delayed decision vectors based on the 1-step delayed state to provide an N-step trace-back state to a next processing element, wherein the N-step trace-back state represents a state traced back by N steps through the most likely path based on the 1-step delayed state.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 4:
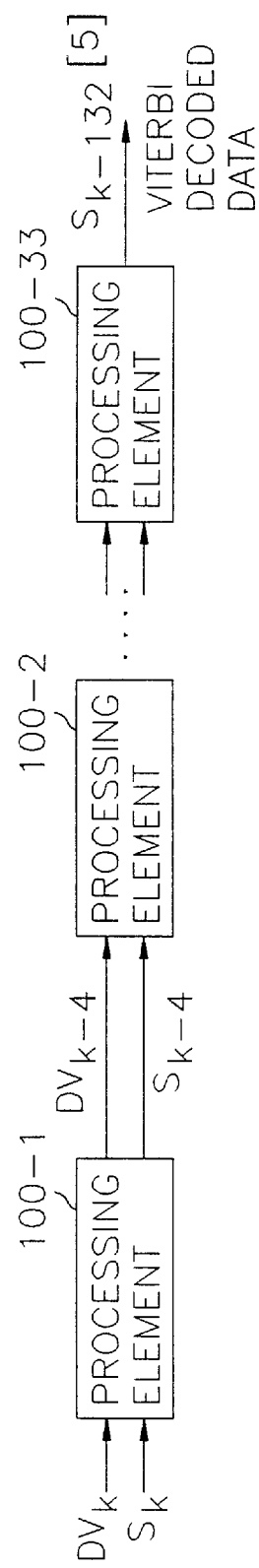
FIG. 4 illustrates an array of 33 processing elements in a pipeline trace-back fashion of a survivor memory unit in accordance with the present invention.

Referring to FIG. 4, there is shown an exemplary array of 33 processing elements in a pipeline trace-back fashion of a survivor memory unit in accordance with the present invention, wherein trace-back is carried out in a unit of three steps in each processing element of 33 processing elements in order to trace back over the decoding depth of 96 steps for the survivor memory unit. To carry out trace-back in a unit of four steps in a processing element, it is preferably required to have 25 processing elements for the decoding depth of 96 steps.

In FIG. 4, a decision vector $DV_k$ and any state $S_k$ are inputted to a first processing element 100-1 and, in a same clock period, another decision vector $DV_{k-4}$ and another state $S_{k-4}$ are inputted to a second processing element 100-2, and so on, wherein the decision vector $DV_{k-4}$ represents a four-step preceding decision vector of the decision vector $DV_k$ and the state $S_{k-4}$ is a state which results from three-step trace-backs from a state $S_{k-1}$ in the first processing element 100-1.

Figure 5:
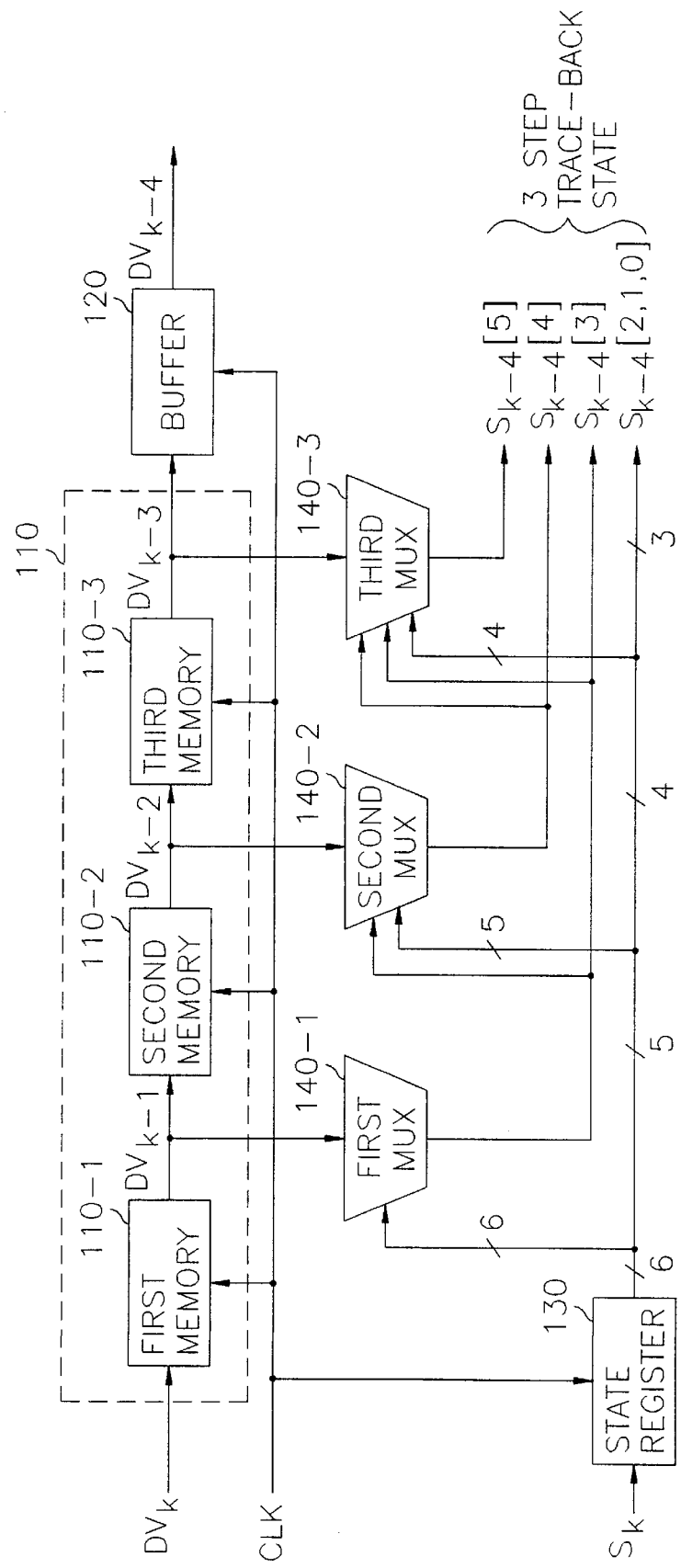
FIG. 5 presents a block diagram of a processing element in FIG. 4 for carrying out a three-step trace-back in accordance with the present invention.

Referring to FIG. 5, there is shown a block diagram of a processing element of the survivor memory unit in accordance with the present invention. For the purposes of illustration, it is assumed that constraint length K=7, code ratio $k_0/n_0=\frac{1}{2}$, decoding depth D=96 and three-step trace-back per one clock period is carried out. Each processing element comprises a delay 110 having first, second and third memories 110-1 to 110-3; a buffer 120; first, second and third multiplexors 140-1 to 140-3; and a state register 130.

In each clock period, a decision vector $DV_k$ is shifted into the first memory 110-1 of the delay 110; a one-step preceding decision vector $DV_{k-1}$ already present in the first memory 110-1 is shifted to the second memory 110-2 and the first multiplexor 140-1; a two-step preceding decision vector $DV_{k-2}$ is shifted to the third memory 110-3 and the second multiplexor 140-2; and a three-step preceding decision vector $DV_{k-3}$ is shifted to the buffer 120 and the third multiplexor 140-3. The four-step preceding decision vector $DV_{k-4}$ already present in the buffer 120 is provided to a delay of the next processing element. In other words, each decision vector DV is shifted rightward by one step in each clock period.

Also during each clock period, a state $S_k$ is coupled to the state register 130; and a 6-bit preceding state $S_{k-1}[5 \ldots 0]$ already present is coupled to the first multiplexor 140-1 as a first selection signal for selecting one bit corresponding thereto among bits forming the one-step preceding decision vector $DV_{k-1}$ as a first decision bit. The first decision bit selected by the first selection signal is provided to the second multiplexor 140-2 as a lowest order bit, i.e., a fifth-order bit $S_{k-2}[5]$ of one-step traced-back state $S_{k-2}$ of $S_{k-1}$ and a fourth-order bit $S_{k-3}[4]$ of two-step trace-back state $S_{k-3}$ of $S_{k-1}$.

The lower 5 bits $S_{k-1}[5 \ldots 1]$ except a highest order bit $S_{k-1}[0]$ of $S_{k-1}[5 \ldots 0]$ are shifted by one bit to generate $S_{k-2}[4 \ldots 0]$ and, therefore, the one-step traced-back state $S_{k-2}[5 \ldots 0]$ of $S_{k-1}$ is coupled to the second multiplexor 140-2 as a second selection signal for selecting one bit corresponding thereto among bits forming the two-step preceding decision vector $DV_{k-2}$ as a second decision bit. The second decision bit selected by the second selection signal is provided to the third multiplexor 140-3 as a fifth-order bit $S_{k-3}[5]$ of two-step trace-back state $S_{k-3}$ of $S_{k-1}$.

The anterior 4 bits $S_{k-1}[5 \ldots 2]$ of $S_{k-1}$ are shifted by two bits to generate $S_{k-3}[3 \ldots 0]$ and, therefore, the complete two-step trace-back state $S_{k-3}[5 \ldots 0]$ of $S_{k-1}$ is coupled to the third multiplexor 140-3 as a third selection signal for selecting one bit corresponding thereto among bits of the three-step preceding decision vector $DV_{k-3}$ as a third decision bit. The third decision bit selected by the third selection signal is provided as a lowest order bit, i.e., a fifth-order bit $S_{k-4}[5]$ of three-step trace-back state $S_{k-4}$ of $S_{k-1}$.

The lower 3 bits $S_{k-1}[5 \ldots 3]$ of $S_{k-1}$ are shifted to the higher order by three bits to generate $S_{k-4}[2 \ldots 0]$ and $S_{k-2}[5]$, i.e., $S_{k-3}[4]$, and $S_{k-3}9$ correspond to $S_{k-4}[3]$ and $S_{k-4}[4]$, respectively, so that a complete three-step trace-back state $S_{k-4}[5 \ldots 0]$ of $S_{k-1}$ is provided to a state register (not drawn) of the next processing element.

Since the first, the second and the third multiplexors operate in a sequence in accordance with the input of a complete 6-bit state in one clock period, an operating time of each multiplexor must be at most ⅓ of a clock period so that it is possible to trace back by three steps in one clock period. The shorter the operating time of each multiplexor, the more steps the trace-back can be. In FIG. 4 and FIG. 5, a trace-back apparatus for tracing back by three steps per one clock period is shown for the purpose of illustration.

Figure 1:
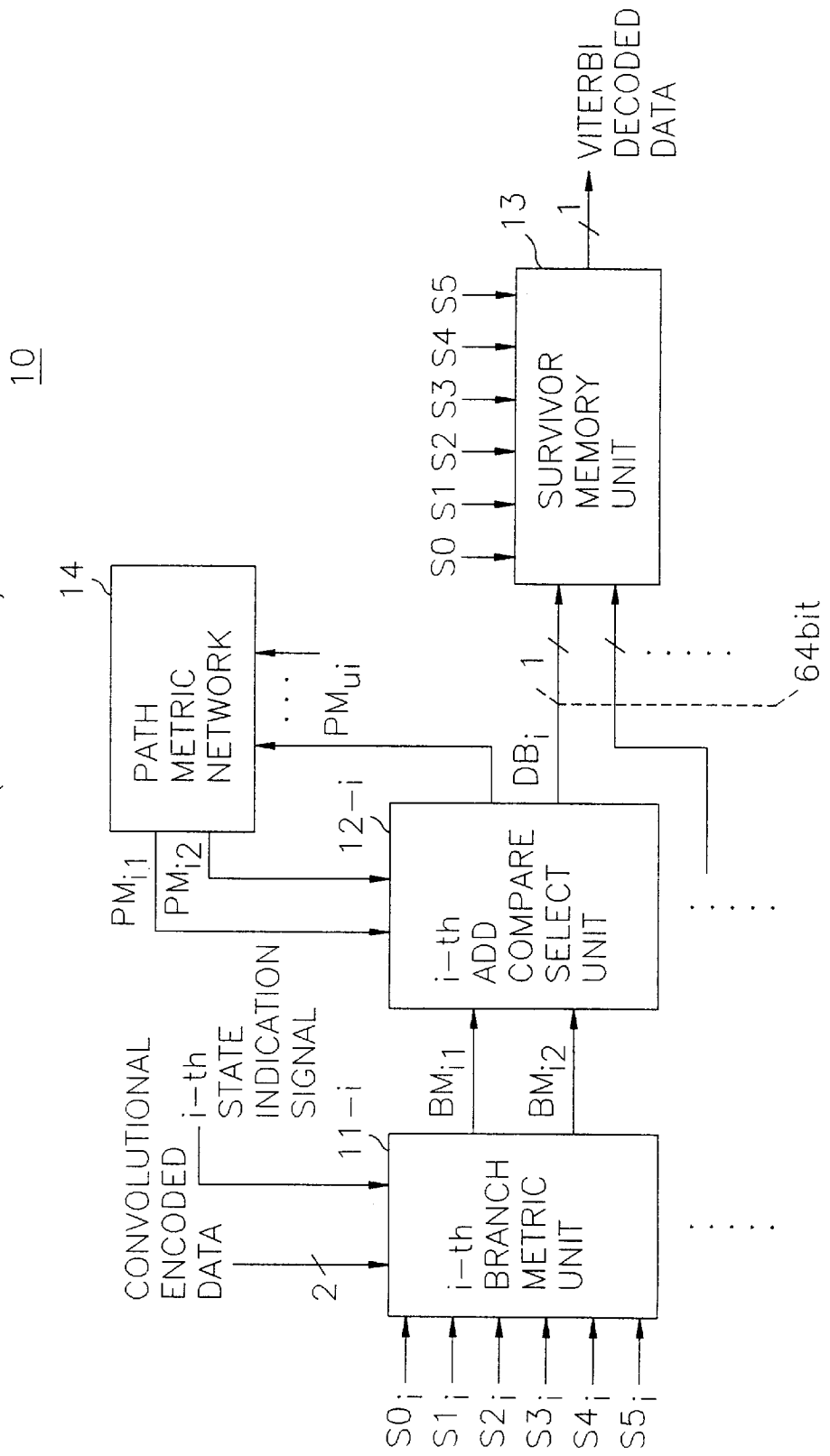
FIG. 1 represents a schematic diagram of a conventional Viterbi decoder.
Figure 2:
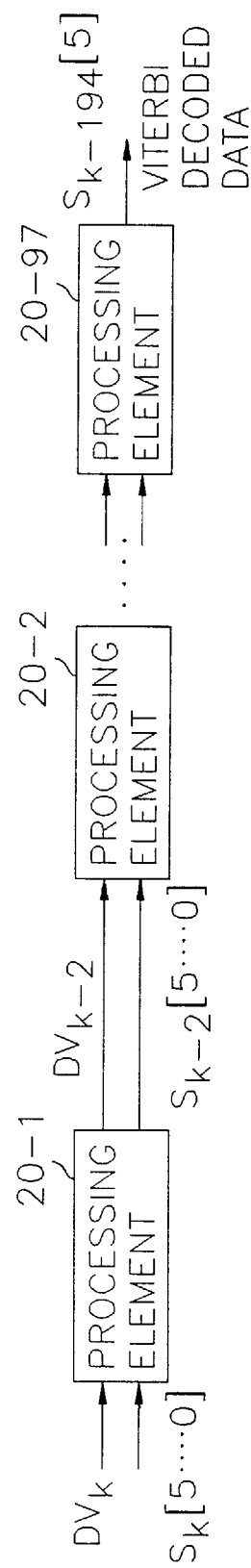
FIG. 2 provides an array of 97 processing elements in a pipeline trace-back fashion for illustrating a survivor memory unit in FIG. 1.
Figure 3:
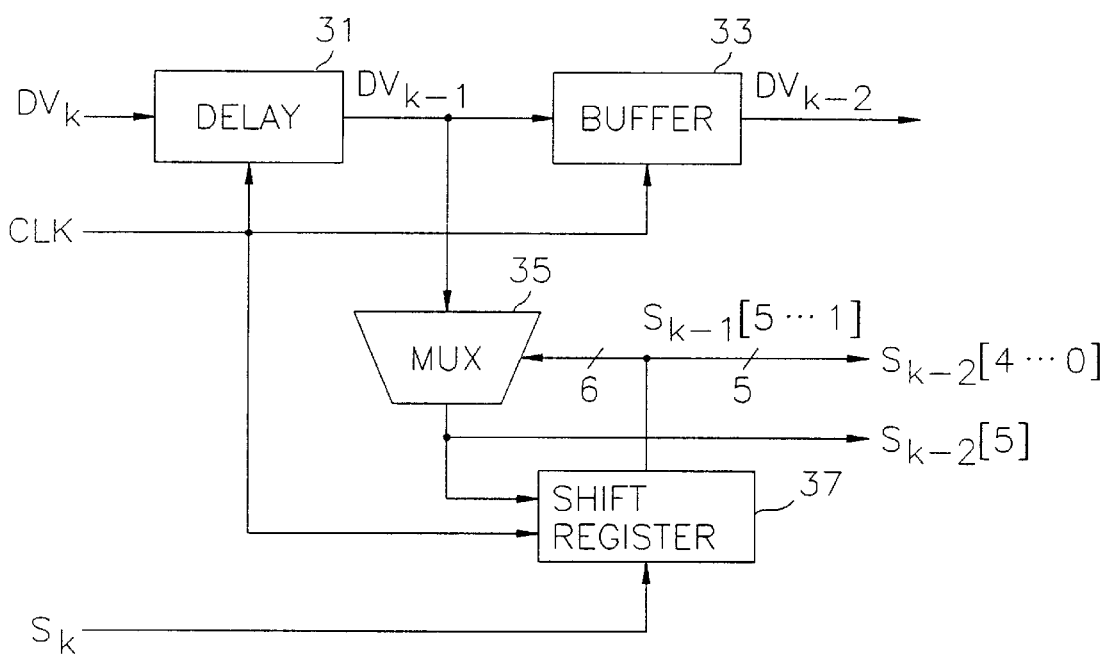
FIG. 3 shows a block diagram of a processing element in FIG. 2 for carrying out a one-step trace-back.

As described in FIG. 3 and FIG. 5, the conventional trace-back apparatus requires six 64-bit registers, three 64:1 multiplexors and three 6-bit registers for tracing back a state by three steps, while a trace-back apparatus in accordance with the present invention needs only four 64-bit registers, three 64:1 multiplexors and one 6-bit register for a three-step trace-back per one clock period, thereby simplifying the apparatus significantly.

While the present invention has been described with respect to the particular embodiments, it will be apparent to those skilled in the art that various changes and modifications may be made without departing from the scope and spirit of the invention as defined in the following claims.

What is claimed is:

1. A trace-back apparatus to select a most likely path for use in a Viterbi decoder with a code rate $k_0/n_0$, $n_0$ channel symbols being generated by the encoder for $k_0$ bits of input data, wherein one or more processing elements, determined based on a decoding depth D, to carry out tracing-back based on a sequence of decision vectors, are coupled among themselves in a pipeline fashion, each processing element comprising:

means for delaying a number, N, of decision vectors during a predetermined period to generate 1-step to N-step delayed decision vectors, wherein the decision vectors are sequentially inputted at an interval of the predetermined period and N is greater than 1 and equal to or less than the decoding depth D;

means for storing an N-step delayed decision vector during the predetermined period to provide an (N+1)-step delayed decision vector already present to a next processing element;

means for saving an input state during the predetermined period to generate a 1-step delayed state; and means for multiplexing sequentially the 1-step to N-step delayed decision vectors based on the 1-step delayed state to provide an N-step trace-back state to the next processing element, wherein the N-step trace-back state represents a state traced back by N steps through the most likely path based on the 1-step delayed state.

2. The apparatus according to claim 1, wherein the delaying means includes N number of serially coupled registers.

3. The apparatus according to claim 1, wherein the multiplexing means includes N multiplexors to select N sets of 1-step to N-step decision bits among 1-step to N-step delayed decision vectors, respectively, based on the 1-step delayed state, wherein each set of decision bits with $k_0$ bits represents information on the most likely path among the corresponding decision vector.

4. The apparatus according to claim 3, wherein an i-th multiplexor selects a set of i-step decision bits among bits forming an i-step delayed decision vector, based on an (i-1)-step trace-back state, to provide an i-step trace-back state to an (i+1)-st multiplexor, i ranging from 1 to N, wherein the set of i-step decision bits with $k_0$ bits is referred to as lowest $k_0$ bits of the i-step trace-back state and lowest (N1)x $K_0$ bits of the (i-1)-step trace-back state are shifted by $k_0$ bits to be referred to as remaining bits of the i-step trace-back state.

5. A trace-back method to select a most likely path for use in a Viterbi decoder with a code rate $k_0/n_0$, $n_0$ channel symbols being generated by the encoder for $k_0$ bits of input data, wherein one or more processing elements, to carry out tracing-back based on a sequence of decision vectors, are coupled among themselves in a pipeline fashion an, N-step trace-back method in each processing element comprising the steps of:

(a) means for delaying a number, N, of decision vectors during a predetermined period to generate 1-step to N-step delayed decision vectors, wherein the decision vectors are sequentially inputted at an interval of the predetermined period and N is greater than 1 and equal to or less than the decoding depth D;

(b) storing an N-step delayed decision vector during the predetermined period to provide the (N+1)-step delayed decision vector already present to a next processing element;

(c) saving an input state during the predetermined period to generate a 1-step delayed state; and (d) multiplexing sequentially the 1-step to N-step delayed decision vectors based on the 1-step delayed state to provide an N-step trace-back state to the next processing element, wherein the N-step trace-back state represents a state traced back by N steps through the most likely path based on the 1-step delayed state.

6. The method according to claim 5, wherein the multiplexing step includes N multiplexing stages to select N sets of 1-step to N-step decision bits among 1-step to N-step delayed decision vectors, respectively, based on the 1-step delayed state, wherein each set of decision bits with $k_0$ bits represents information on the most likely path among the corresponding decision vector.

7. The method according to claim 6, wherein an i-th multiplexing stage selects as a set of i-step decision bits among bits forming an i-step delayed decision vector, based on an (i-1)-step trace-back state, to provide an i-step trace-back state to an (i+1)-st multiplexing stage, i ranging from 1 to N, wherein the set of i-step decision bits with $k_0$ bits is referred to as lowest $k_0$ bits of the i-step trace-back state and lowest (N-1)x$k_0$ bits of the (i-1)-step trace-back state are shifted by $k_0$ bit to be referred to as remaining bits of the i-step trace-back state.

* * * * *